(12) United States Patent
Chawla et al.

(10) Patent No.: US 8,031,019 B2
(45) Date of Patent: Oct. 4, 2011

(54) INTEGRATED VOLTAGE-CONTROLLED OSCILLATOR CIRCUITS

(75) Inventors: Vipul Chawla, San Diego, CA (US); Shen Wang, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 124 days.

(21) Appl. No.: 12/363,911

(22) Filed: Feb. 2, 2009

(65) Prior Publication Data
US 2010/0194485 A1    Aug. 5, 2010

(51) Int. Cl.
H03B 5/12 (2006.01)
H03B 21/00 (2006.01)
H04B 1/24 (2006.01)
H04B 1/40 (2006.01)

(52) U.S. Cl. .............. 331/117 FE; 331/40; 331/177 V; 455/118; 455/262; 455/323; 455/325; 455/333

(58) Field of Classification Search .............. 331/37, 331/40, 41, 117 FE, 117 R, 167, 177 V, 36 C; 455/118, 119, 258, 262, 313, 318, 319, 323, 455/325, 326, 333
See application file for complete search history.

(56) References Cited

U.S. PATENT DOCUMENTS

| | | | |
|---|---|---|---|
| 4,818,953 A | 4/1989 | Feldstein | |
| 6,201,287 B1 | 3/2001 | Forbes | |
| 6,356,602 B1 | 3/2002 | Rodal et al. | |
| 6,606,008 B2 | 8/2003 | Traub | |
| 6,867,656 B2 | 3/2005 | Hajimiri et al. | |
| 6,982,605 B2 * | 1/2006 | Mondal et al. | 331/117 R |
| 7,107,035 B2 * | 9/2006 | Otaka | 455/323 |
| 7,116,183 B2 | 10/2006 | Wu | |
| 7,154,349 B2 * | 12/2006 | Cabanillas | 331/117 R |
| 7,250,826 B2 * | 7/2007 | Gabara | 331/117 R |
| 7,336,134 B1 | 2/2008 | Janesch et al. | |
| 7,446,617 B2 * | 11/2008 | Jang et al. | 331/55 |
| 7,724,102 B2 | 5/2010 | Ullmann | |
| 2004/0203479 A1 | 10/2004 | Lin | |
| 2005/0046499 A1 | 3/2005 | Luong et al. | |
| 2006/0181362 A1 * | 8/2006 | Ikuta et al. | 331/167 |
| 2007/0057740 A1 | 3/2007 | Ryu et al. | |
| 2007/0188255 A1 | 8/2007 | Strandberg | |
| 2008/0174378 A1 | 7/2008 | Cusmai et al. | |

(Continued)

OTHER PUBLICATIONS

Li, et al., "A 21 GHz Complementary Transformer Coupled CMOS VCO," IEEE Microwave and Wireless Components Letters, vol. 18, No. 4, Apr. 2008.

(Continued)

*Primary Examiner* — Levi Gannon
(74) *Attorney, Agent, or Firm* — Eric Ho

(57) ABSTRACT

Techniques for providing voltage-controlled oscillator circuits having improved phase noise performance and lower power consumption. In an exemplary embodiment, a voltage controlled oscillator (VCO) is coupled to a mixer or a frequency divider such as a divide-by-two circuit. The VCO includes a transistor pair with magnetically cross-coupled inductors, and variable capacitance coupled to the gates of the transistor pair. In an exemplary embodiment, a frequency divider is configured to divide the frequency of the differential current flowing through the transistor pair to generate the LO output. In an alternative exemplary embodiment, a mixer is configured to mix the differential current flowing through the transistor pair with another signal. The VCO and mixer or frequency divider share common bias currents, thereby reducing power consumption. Various exemplary apparatuses and methods utilizing these techniques are disclosed.

19 Claims, 10 Drawing Sheets

U.S. PATENT DOCUMENTS

2008/0197894 A1     8/2008    Jang et al.
2008/0272851 A1    11/2008    Lin et al.
2009/0184774 A1*    7/2009    Deng et al. .............. 331/117 FE
2009/0251207 A1    10/2009    Plevridis et al.

OTHER PUBLICATIONS

Lee, et al., "A Transformer-based Low Phase Noise and Widely Tuned CMOS Quadrature VCO," Circuits and Systems 2006, IEEE ISCAS 2006.

Lee, et al., "Q-Enhanced 5 GHz CMOS VCO Using 4-port Transformer," Silicon Monolithic Integrated Circuits in RF Systems, 2007 Topical Meeting on (Jan. 2007).

Kyung-Gyu Park, et al., "Current Reusing VCO and Divided-by-Two Frequency Divider for Quadrature LO Generation," IEEE Microwave and Wireless Components Letters, pp. 413-415, Jun. 2008.

To-Po Wang, et al., "A Low-Power Oscillator Mixer in 0.18-µm CMOS Technology", IEEE Transactions on Microwave Theory and Techniques, pp. 88-95, Jan. 2006.

International Search Report and Written Opinion—PCT/US2010/022937, International Search Authority—European Patent Office—Aug. 9, 2010.

Leung, Lincoln L. K. et al: "A 1-V, 9.7mW CMOS Frequency Synthesizer for WLAN 802.11a Transceivers," 2005 Symposium on VLSI Circuits Digest of Technical Papers. Piscataway, NJ, USA, (Jun. 16, 2005), pp. 252-255, XP010818423, DOI:10.1109/VLSIC. 2005.1469379, ISBN: 978-4-900784-01-7.

Park, Dongmin et al.: "A 1.8 V 900 W 4.5 GHz VCO and Prescaler in 0.18 m CMOS Using Charge-Recycling Technique," IEEE Microwave and Wireless Components Letters, vol. 19 (2), pp. 104-106, Feb. 1, 2009.

\* cited by examiner

INTEGRATED VOLTAGE-CONTROLLED OSCILLATOR CIRCUITS

TECHNICAL FIELD

The disclosure relates to integrated circuit design, and, more particularly, to the design of voltage-controlled oscillator (VCO) circuits.

BACKGROUND

In a communications transceiver for a wireless communications system, a local oscillator (LO) generates a signal with a predetermined frequency to be mixed with transmit and/or receive signals. An LO design may include a voltage-controlled oscillator (VCO) coupled to a frequency divider circuit used to divide down the frequency of the VCO output. The LO output may be coupled to a mixer that mixes the VCO output signal with another signal to generate a signal having an upconverted or downconverted frequency. A VCO buffer may be provided between the VCO output and the frequency divider or mixer to isolate the VCO output from subsequent loads.

There are often stringent requirements on the allowable in-band and out-of-band phase-noise generated at the LO output. For example, in the GSM and CDMA communication systems, the out-of-band phase noise requirement can be difficult to meet under a given power budget. The far-offset phase noise of the LO output is often dominated by contributions from the VCO buffer and the frequency divider. With proper circuit design, the VCO buffer may be eliminated; however, the frequency divider may still contribute significant phase noise. Reducing the phase noise of the frequency divider is typically achieved only by consuming a great deal of power. Similarly, the provision of a VCO and a mixer as separate circuit blocks may also consume significant power.

It would be desirable to reduce power consumption by integrating the functionality of the VCO with the frequency divider or mixer, while minimizing both near-offset and far-offset phase noise at the LO output.

SUMMARY

An aspect of the present disclosure provides an apparatus comprising a voltage controlled oscillator (VCO) coupled to a mixer, the VCO comprising: a first transistor configured to be DC biased by a first bias current; a second transistor configured to be DC biased by a second bias current; at least one gate inductance coupling the gate of the first transistor to the gate of the second transistor; a first drain inductance magnetically coupled to a gate inductance, the first drain inductance coupled to the drain of the first transistor; a second drain inductance magnetically coupled to a gate inductance, the second drain inductance coupled to the drain of the second transistor; and at least one variable capacitance coupling the gate of the first transistor to the gate of the second transistor; the mixer comprising first and second input nodes coupled to the first and second drain inductances, respectively, the mixer configured to be biased by the first and second bias currents.

Another aspect of the present disclosure provides an apparatus comprising a voltage controlled oscillator (VCO) coupled to a frequency divider circuit, the VCO comprising: a first transistor configured to be DC biased by a first bias current; a second transistor configured to be DC biased by a second bias current; at least one gate inductance coupling the gate of the first transistor to the gate of the second transistor; a first drain inductance magnetically coupled to a gate inductance, the first drain inductance coupled to the drain of the first transistor; a second drain inductance magnetically coupled to a gate inductance, the second drain inductance coupled to the drain of the second transistor; and at least one variable capacitance coupling the gate of the first transistor to the gate of the second transistor; the frequency divider circuit comprising first and second input nodes coupled to the first and second drain inductances, respectively, the frequency divider configured to be biased by the first and second bias currents.

Yet another aspect of the present disclosure provides a method for generating a mixed signal, the method comprising: DC biasing a first transistor using a first bias current; DC biasing a second transistor using a second bias current; coupling the gate of the first transistor to the gate of the second transistor using at least one gate inductance; magnetically coupling a first drain inductance to a gate inductance, the first drain inductance coupled to the drain of the first transistor; magnetically coupling a second drain inductance to a gate inductance, the second drain inductance coupled to the drain of the second transistor; selecting the capacitance of a variable capacitance element coupling the gate of the first transistor to the gate of the second transistor; mixing the differential current flowing in the first and second drain inductances with another signal using a mixer to generate at least one mixed signal; and biasing the mixer using the first and second bias currents.

Yet another aspect of the present disclosure provides a method for generating a frequency divided signal, the method comprising: DC biasing a first transistor using a first bias current; DC biasing a second transistor using a second bias current; coupling the gate of the first transistor to the gate of the second transistor using at least one gate inductance; magnetically coupling a first drain inductance to a gate inductance, the first drain inductance coupled to the drain of the first transistor; magnetically coupling a second drain inductance to a gate inductance, the second drain inductance coupled to the drain of the second transistor; selecting the capacitance of a variable capacitance element coupling the gate of the first transistor to the gate of the second transistor; dividing the frequency of said differential current flowing in the first and second drain inductances using a frequency divider to generate at least one frequency divided signal; and biasing the frequency divider using the first and second bias currents.

Yet another aspect of the present disclosure provides an apparatus comprising: voltage controlled oscillator (VCO) means for generating a differential VCO output current having a voltage-controlled frequency, the VCO configured to be biased by at least one bias current; and mixer means for mixing the VCO output current with another signal, wherein the mixer means is configured to share the at least one bias current with the VCO means.

Yet another aspect of the present disclosure provides an apparatus comprising: voltage controlled oscillator (VCO) means for generating a differential VCO output current having a voltage-controlled frequency, the VCO configured to be biased by at least one bias current; and frequency divider means for dividing a frequency of the VCO output signal, wherein the frequency divider means is configured to share the at least one bias current with the VCO means.

Yet another aspect of the present disclosure provides a device for wireless communications, the device comprising a TX LO signal generator, at least one baseband TX amplifier, an upconverter coupled to the TX LO signal generator and the at least one baseband TX amplifier, a TX filter coupled to the output of the upconverter, a power amplifier (PA) coupled to the TX filter, an RX LO signal generator, an RX filter, a downconverter coupled to the RX LO signal generator and the RX filter, a low-noise amplifier (LNA) coupled to the RX filter, and a duplexer coupled to the PA and the LNA, at least one of the TX LO signal generator and RX LO signal generator comprising a voltage controlled oscillator (VCO) coupled to a frequency divider, the VCO comprising: a first transistor configured to be DC biased by a first bias current; a second transistor configured to be DC biased by a second bias current; at least one gate inductance coupling the gate of the first transistor to the gate of the second transistor; a first drain inductance magnetically coupled to a gate inductance, the first drain inductance coupled to the drain of the first transistor; a second drain inductance magnetically coupled to a gate inductance, the second drain inductance coupled to the drain of the second transistor; and at least one variable capacitance coupling the gate of the first transistor to the gate of the second transistor; the frequency divider comprising first and second input nodes coupled to the first and second drain inductances, respectively, the frequency divider configured to be biased by the first and second bias currents.

Yet another aspect of the present disclosure provides a device for wireless communications, the device comprising a TX LO signal generator, at least one baseband TX amplifier, an upconverter coupled to the TX LO signal generator and the at least one baseband TX amplifier, a TX filter coupled to the output of the upconverter, a power amplifier (PA) coupled to the TX filter, an RX LO signal generator, an RX filter, a downconverter coupled to the RX LO signal generator and the RX filter, a low-noise amplifier (LNA) coupled to the RX filter, and a duplexer coupled to the PA and the LNA, the TX LO signal generator and upconverter comprising a voltage controlled oscillator (VCO) coupled to a mixer, the VCO comprising: a first transistor configured to be DC biased by a first bias current; a second transistor configured to be DC biased by a second bias current; at least one gate inductance coupling the gate of the first transistor to the gate of the second transistor; a first drain inductance magnetically coupled to a gate inductance, the first drain inductance coupled to the drain of the first transistor; a second drain inductance magnetically coupled to a gate inductance, the second drain inductance coupled to the drain of the second transistor; and at least one variable capacitance coupling the gate of the first transistor to the gate of the second transistor; the mixer comprising first and second input nodes coupled to the first and second drain inductances, respectively, the mixer configured to be biased by the first and second bias currents.

Yet another aspect of the present disclosure provides a device for wireless communications, the device comprising a TX LO signal generator, at least one baseband TX amplifier, an upconverter coupled to the TX LO signal generator and the at least one baseband TX amplifier, a TX filter coupled to the output of the upconverter, a power amplifier (PA) coupled to the TX filter, an RX LO signal generator, an RX filter, a downconverter coupled to the RX LO signal generator and the RX filter, a low-noise amplifier (LNA) coupled to the RX filter, and a duplexer coupled to the PA and the LNA, the RX LO signal generator and downconverter comprising a voltage controlled oscillator (VCO) coupled to a mixer, the VCO comprising: a first transistor configured to be DC biased by a first bias current; a second transistor configured to be DC biased by a second bias current; at least one gate inductance coupling the gate of the first transistor to the gate of the second transistor; a first drain inductance magnetically coupled to a gate inductance, the first drain inductance coupled to the drain of the first transistor; a second drain inductance magnetically coupled to a gate inductance, the second drain inductance coupled to the drain of the second transistor; and at least one variable capacitance coupling the gate of the first transistor to the gate of the second transistor; the mixer comprising first and second input nodes coupled to the first and second drain inductances, respectively, the mixer configured to be biased by the first and second bias currents.

DETAILED DESCRIPTION

The detailed description set forth below in connection with the appended drawings is intended as a description of exemplary embodiments of the present invention and is not intended to represent the only exemplary embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 1:
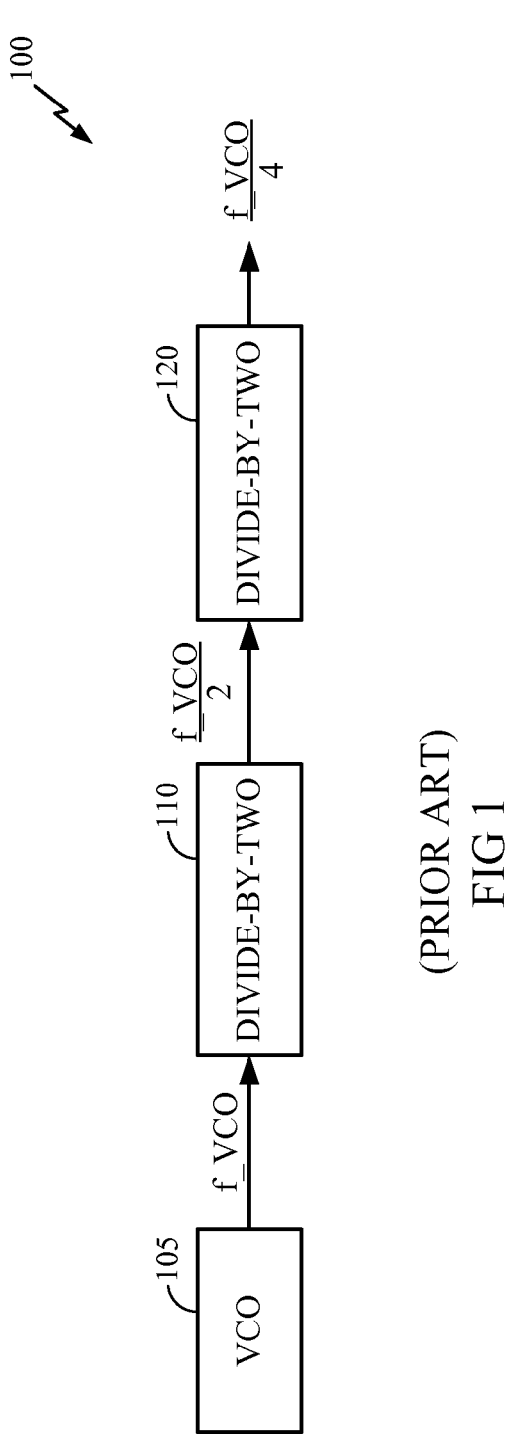
FIG. 1 illustrates a prior art implementation of a local oscillator (LO) generator utilizing a voltage-controlled oscillator (VCO)

FIG. 1 illustrates a prior art implementation of a local oscillator (LO) 100 utilizing a voltage-controlled oscillator (VCO) 105. In FIG. 1, the VCO 105 generates an output signal having frequency f_VCO. The VCO output signal is coupled to a divide-by-two circuit 110, which divides the frequency of the VCO output by a factor of two. The divide-by-two circuit 110 may be followed by another divide-by-two circuit 120, to generate an output signal having a frequency f_VCO/4. Note in alternative exemplary embodiments (not shown), the second divide-by-two circuit 120 may be omitted, and any number of divide-by-two or any other frequency divider circuits may be provided after the VCO 105 to adjust the VCO frequency accordingly.

Figure 1A:
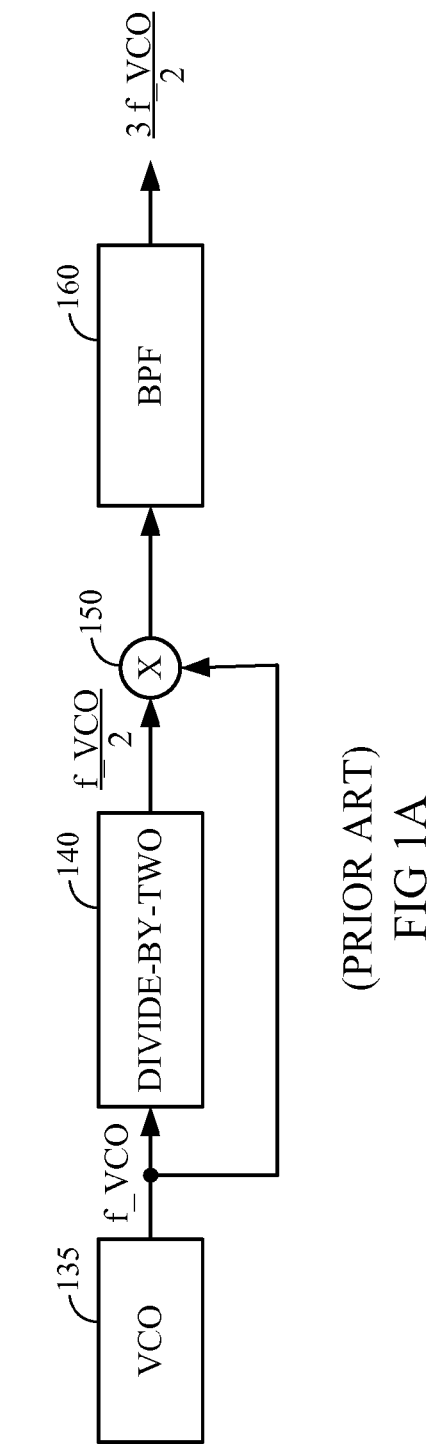
FIG. 1A illustrates another prior art implementation of an LO utilizing a VCO and a mixer.

FIG. 1A illustrates another prior art implementation of an LO 130 utilizing a VCO 135 and a mixer 150. In FIG. 1A, the output signal of the VCO 135 is coupled to a divide-by-two circuit 140. The output of divide-by-two circuit 140 is mixed with the output signal of the VCO 135 using a mixer 150, and band-pass filtered using band-pass filter (BPF) 160. The output of BPF 160 has a frequency f_VCO*3/2.

The aforementioned prior art schemes employ a VCO coupled to a frequency divider and/or a mixer for generating the LO signal, and are useful for reducing VCO pulling and interference caused by LO leakage. Furthermore, a VCO followed by a divide-by-two circuit may provide more accurate quadrature LO signals than other prior art LO signal generation schemes, e.g., those directly employing quadrature VCO's, or a VCO followed by a poly-phase filter.

Figure 1B:
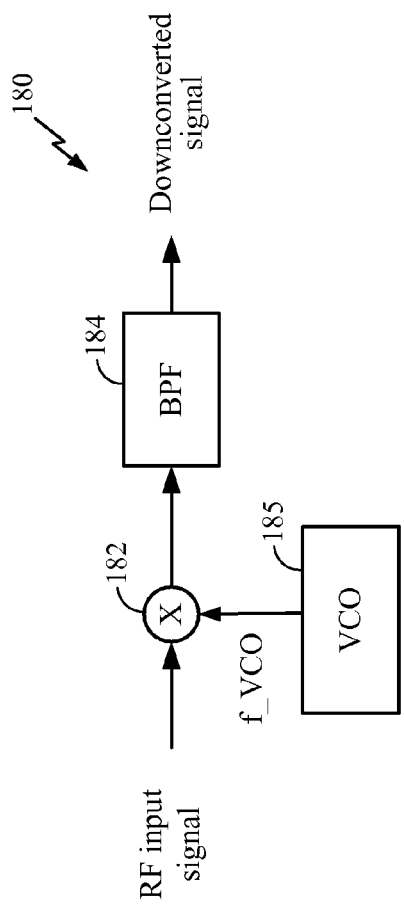
FIG. 1B illustrates a prior art implementation of a VCO coupled to a mixer as part of downconversion circuitry.

FIG. 1B illustrates a prior art implementation of a VCO 185 coupled to a mixer 182 as part of downconversion circuitry 180. In FIG. 1B, an RF signal is mixed with the VCO output using mixer 182, and the mixer output is band-pass filtered by BPF 184 to generate the downconverted signal.

Figure 1C:
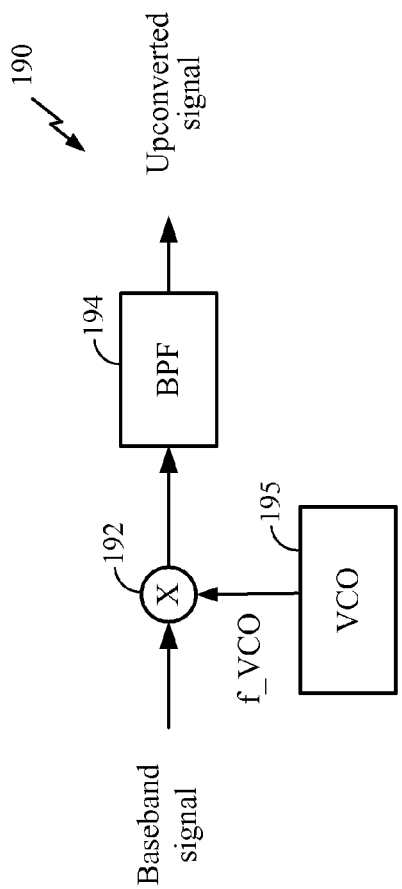
FIG. 1C illustrates a prior art implementation of a VCO coupled to a mixer as part of upconversion circuitry.

FIG. 1C illustrates a prior art implementation of a VCO 195 coupled to a mixer 192 as part of upconversion circuitry 190. In FIG. 1C, a baseband signal is mixed with the VCO output using mixer 192, and the mixer output is band-pass filtered by BPF 194 to generate the upconverted signal.

Figure 2:
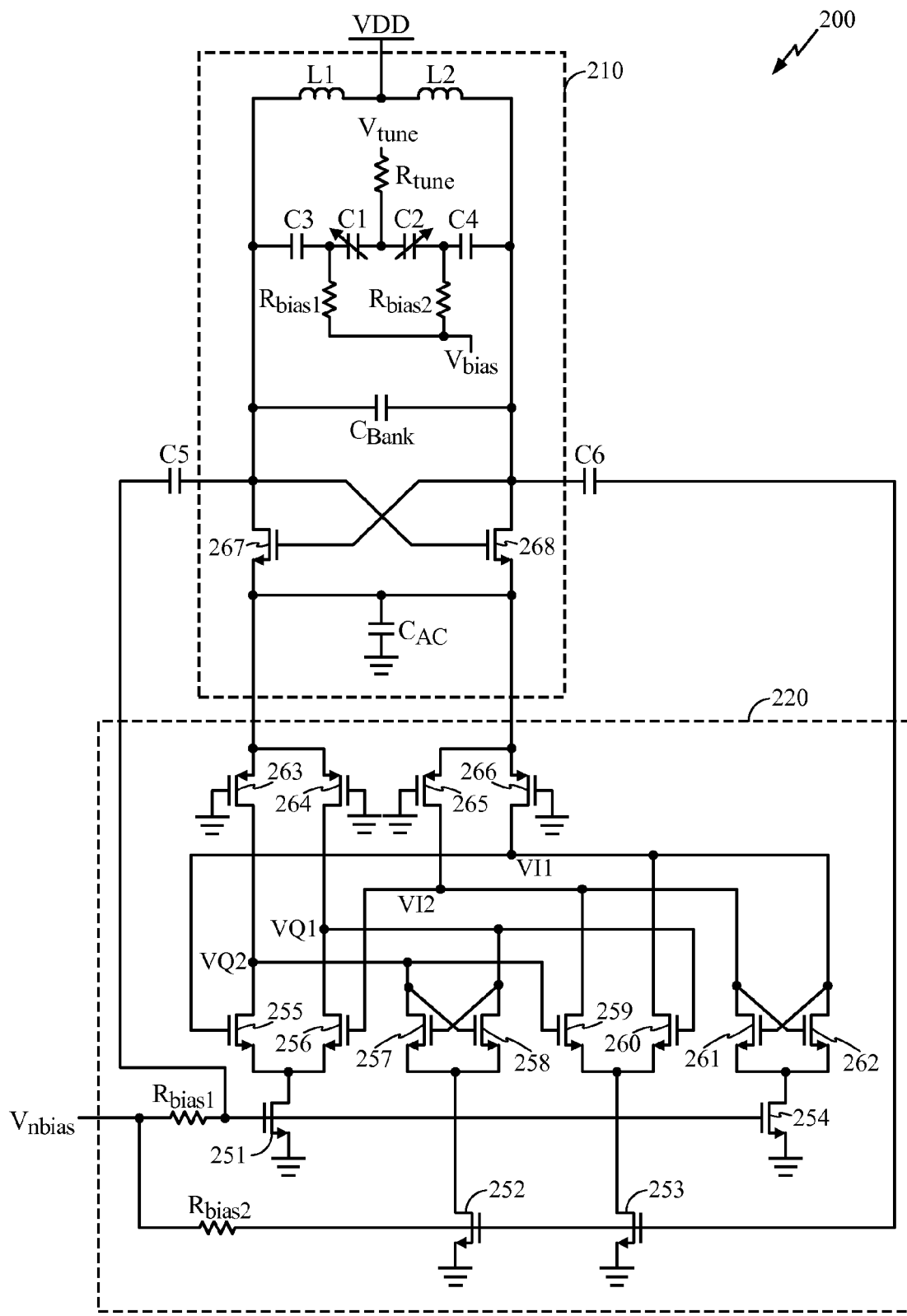
FIG. 2 illustrates a prior art implementation of an LO, wherein a VCO is coupled to a divide-by-two circuit.

FIG. 2 illustrates a prior art implementation of an LO 200 wherein a VCO 210 is coupled to a divide-by-two circuit 220. For further details of the LO 200, see, e.g., Kyung-Gyu Park, et al., "Current Reusing VCO and Divide-by-Two Frequency Divider for Quadrature LO Generation," IEEE Microwave and Wireless Components Letters, pp. 413-415, June 2008.

In FIG. 2, VCO 210 includes a cross-coupled NMOS pair 267, 268 coupled to an LC tank including capacitors $C_{Bank}$, C1, C2, C3, C4, and inductors L1, L2. L1, L2 may also be viewed as a single inductor center-tapped by a DC supply voltage VDD. $C_{Bank}$ may include a bank of switchable capacitors (not shown) for coarse tuning of the tank resonant frequency, while C1, C2 may be varactors whose capacitances are controlled by a fine control voltage Vtune. The varactors C1, C2 may be further biased by a voltage Vbias. During operation of the VCO 210, the LC tank is effectively coupled in parallel with the negative resistance formed by the cross-coupled NMOS pair 267, 268. This causes a differential oscillating signal to be generated across the LC tank at the tank resonant frequency. Note during AC operation, the sources of 267, 268 are coupled to ground via capacitor $C_{AC}$.

In FIG. 2, the differential ends of the VCO oscillating signal are coupled to a frequency divider circuit 220 via coupling capacitors C5 and C6. One end of the differential VCO oscillating signal is coupled to the gates of transistors 251, 254, while the other end is coupled to the gates of transistors 252, 253. The differential VCO oscillating signal selectively modulates the currents flowing through 251-254. The modulated currents are in turn coupled to transistors 255-262, which are configured so as to divide by two the frequency of the modulated currents, in a manner well-known to one of ordinary skill in the art. For the output of the divide-by-two circuit 220, transistors 255-262 generate a differential in-phase voltage across nodes VI1 and VI2, and a differential quadrature voltage across nodes VQ1 and VQ2, both at a frequency half that of the differential currents flowing through 251-254.

One of ordinary skill in the art will appreciate that one disadvantage of the prior art LO 200 is that there is a relatively large number of circuit elements stacked in series between the DC supply voltage VDD and ground, including the cross-coupled transistor pair 267, 268. These elements increase the required supply voltage VDD. Furthermore, capacitors $C_{AC}$, C5, C6 are seen to perform an AC coupling function, and may therefore consume significant die area on an integrated circuit.

Figure 3:
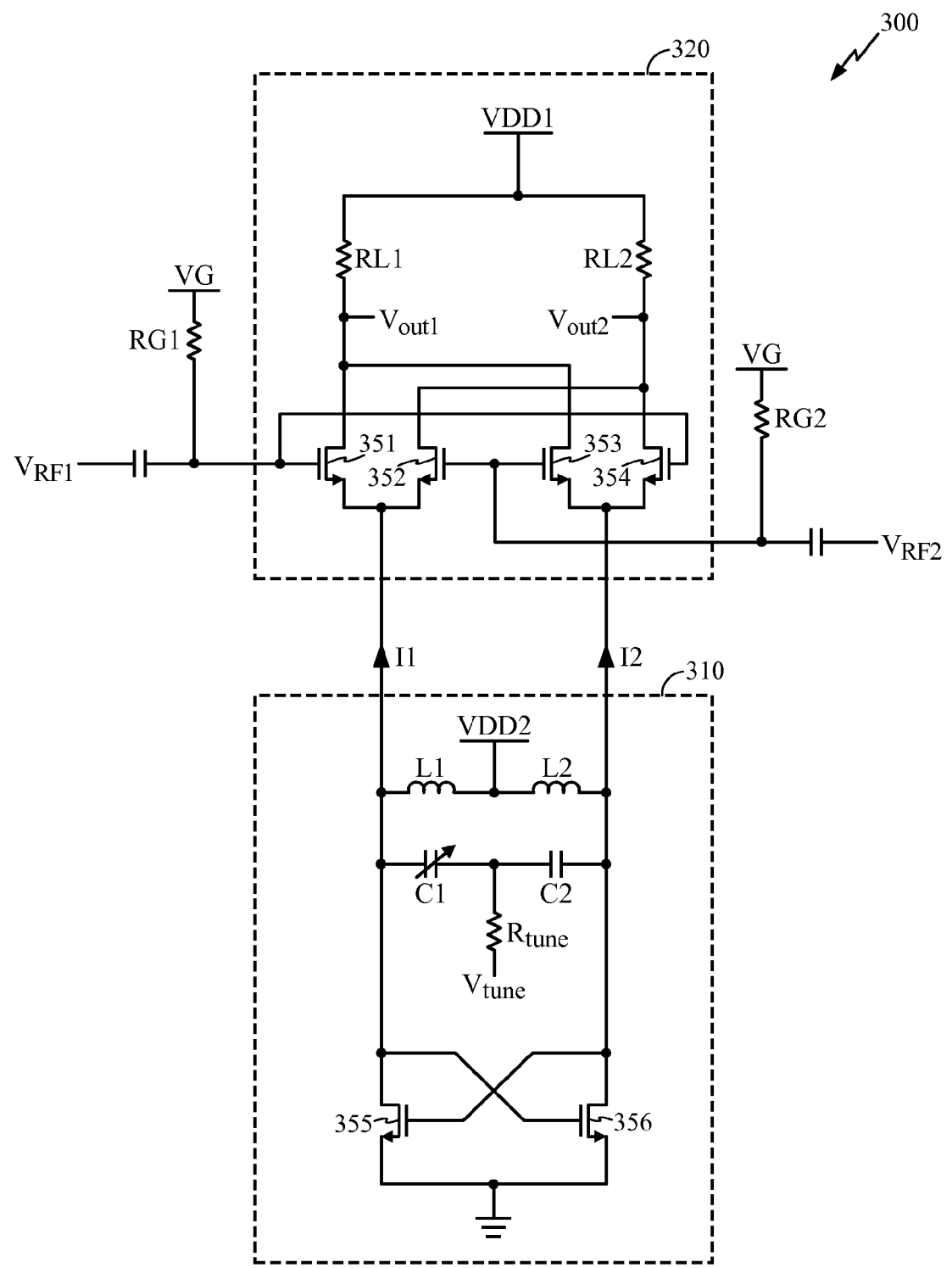
FIG. 3 illustrates an alternative prior art implementation of an LO, wherein a VCO is coupled to a mixer circuit.

FIG. 3 illustrates an alternative prior art implementation of circuitry 300, wherein a VCO 310 is coupled to a mixer 320. For further details of the LO 300, see, e.g., To-Po Wang, et al., "A Low-Power Oscillator Mixer in 0.18-µm CMOS Technology," IEEE Transactions on Microwave Theory and Techniques, pp. 88-95, January 2006.

In FIG. 3, VCO 310 also includes a cross-coupled NMOS pair 355, 356, and an LC tank formed by capacitors C1, C2, and inductors L1, L2, which may also be viewed as a single inductor center-tapped by a DC voltage VDD2. In the VCO 310, the differential current I1-I2 flowing through the NMOS pair 355, 356 contains a component that oscillates at the tank resonant frequency. The currents I1 and I2 are further coupled to transistors 351-354 of the mixer 320, which is configured to mix the differential current I1-I2 with a differential voltage $V_{RF1}$-$V_{RF2}$, in a manner well-known to one of ordinary skill in the art. The output of the mixing is provided as differential voltage $V_{out1}$-$V_{out2}$.

One of ordinary skill in the art will appreciate that one shortcoming of the circuitry 300 is that it requires at least three DC bias voltages VDD1, VDD2, and VG, which may collectively increase the level of noise present in the circuit. Furthermore, as the sources of transistors 351-354 of the mixer 320 are directly coupled to the LC tank of VCO 310, any noise generated by 351-354 may also couple directly to the LC tank, thus adversely affecting the VCO's phase-noise performance.

Figure 4:
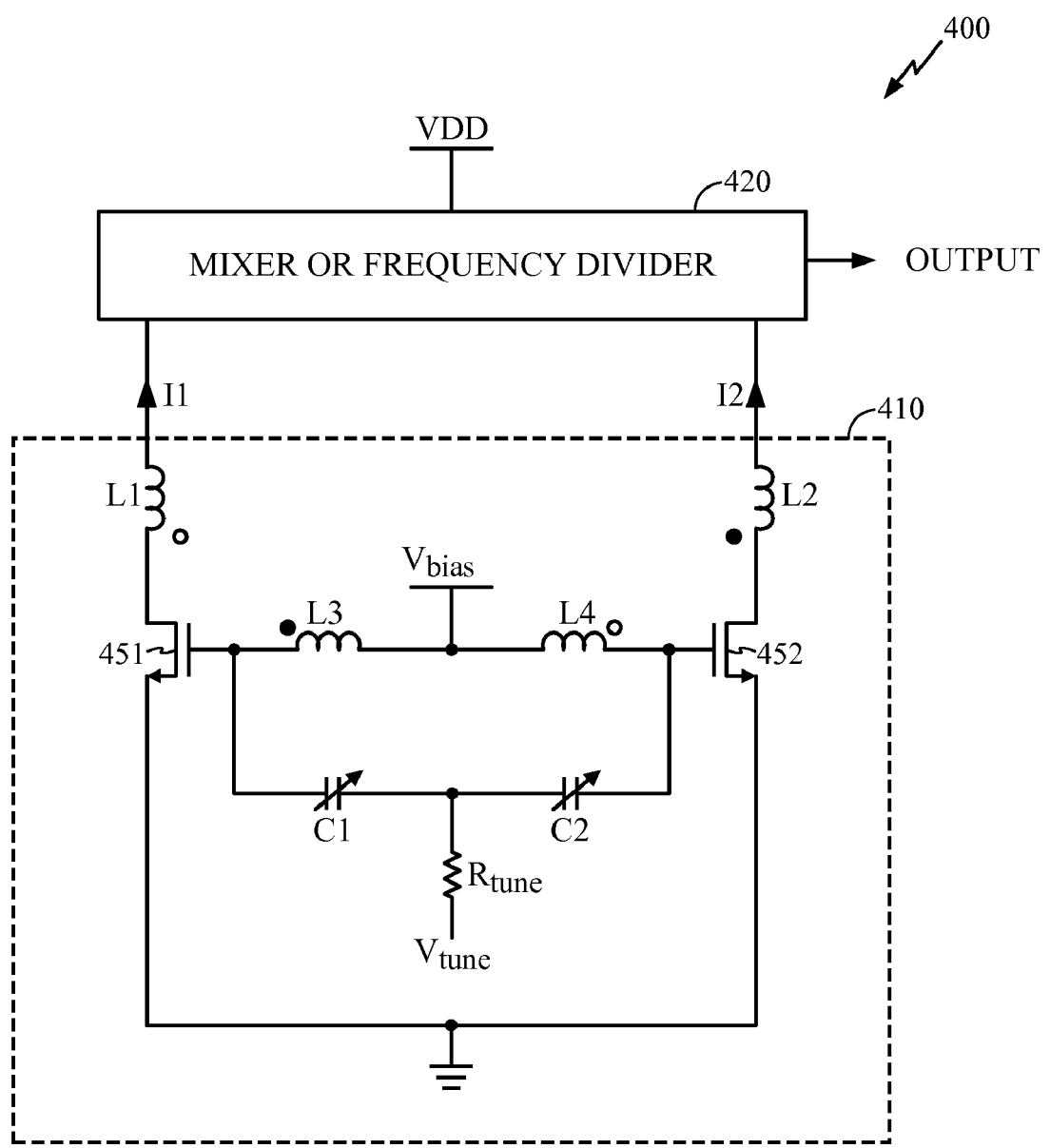
FIG. 4 illustrates an exemplary embodiment of an LO according to the present disclosure.

FIG. 4 illustrates an exemplary embodiment of circuitry 400 according to the present disclosure, wherein a VCO 410 is current-coupled to either a mixer or a frequency divider 420. In FIG. 4, the VCO 410 utilizes a transformer-based design, wherein inductors L2 and L3 are mutually magnetically coupled with the orientation shown, and inductors L1 and L4 are similarly mutually coupled. In an exemplary embodiment, inductors L3 and L4 may be implemented as a single coil, also denoted herein as a primary coil, with the voltage Vbias tapped from an appropriate point (e.g., the center) on the primary coil. Inductors L1 and L2 are also denoted herein as secondary coils. The LC tank variable capacitances (varactors) C1 and C2 are coupled to the gates of 451 and 452, and a further switchable capacitor bank (not shown) may also be provided at the gates of 451 and 452. A voltage Vtune may adjust the capacitance of C1 and C2 through resistance Rtune to control the tank resonant frequency.

During operation of the VCO 410, the currents I1 and I2 contain DC components that bias the transistors 451 and 452, as well as AC components that oscillate at the tank resonant frequency. I1 and I2 are coupled to the mixer or frequency divider 420, with the differential current I1-I2 containing the output signal of the VCO 410.

One of ordinary skill in the art will appreciate that the circuitry 400 offers certain design advantages. For example, the same DC current used to bias the transistors of VCO 410 is used to bias the mixer or frequency divider 420, and therefore the circuitry 400 benefits from "current reuse" to reduce power consumption. Furthermore, as the mixer or frequency divider 420 is coupled to the drains of transistors 451, 452 via inductors L1 and L2, which ideally consume zero DC voltage drop, the VCO 410 consumes minimal voltage headroom from the supply voltage VDD. Furthermore, LC tank elements C1, C2, L3, L4, which are placed at the gates of 451, 452, are isolated from the mixer or frequency divider 420, whose input terminals are placed at the drains of 451, 452. In combination, these advantages are not found in either the prior art circuitry 200 or 300. Note the preceding enumerated advantages are given for illustrative purposes only, and are not meant to restrict the scope of the present disclosure to embodiments that explicitly exhibit the advantages described.

One of ordinary skill in the art will appreciate that the inductors L1, L2 may be relatively low quality factor (low-Q) inductors, and hence may be kept thin without compromising the phase-noise performance of the VCO 410. This is because the phase-noise performance of the transformer-based VCO is generally only weakly dependent on the quality factor of the secondary coils. Furthermore, the primary coil and two secondary coils in 410 may be implemented as a single transformer, wherein the two secondary coils are laid-out as thin coils inside the primary coil, or wherein the two secondary coils are stacked underneath the primary coil in thin metal layers, thus avoiding the area overhead of additional coils.

Figure 5:
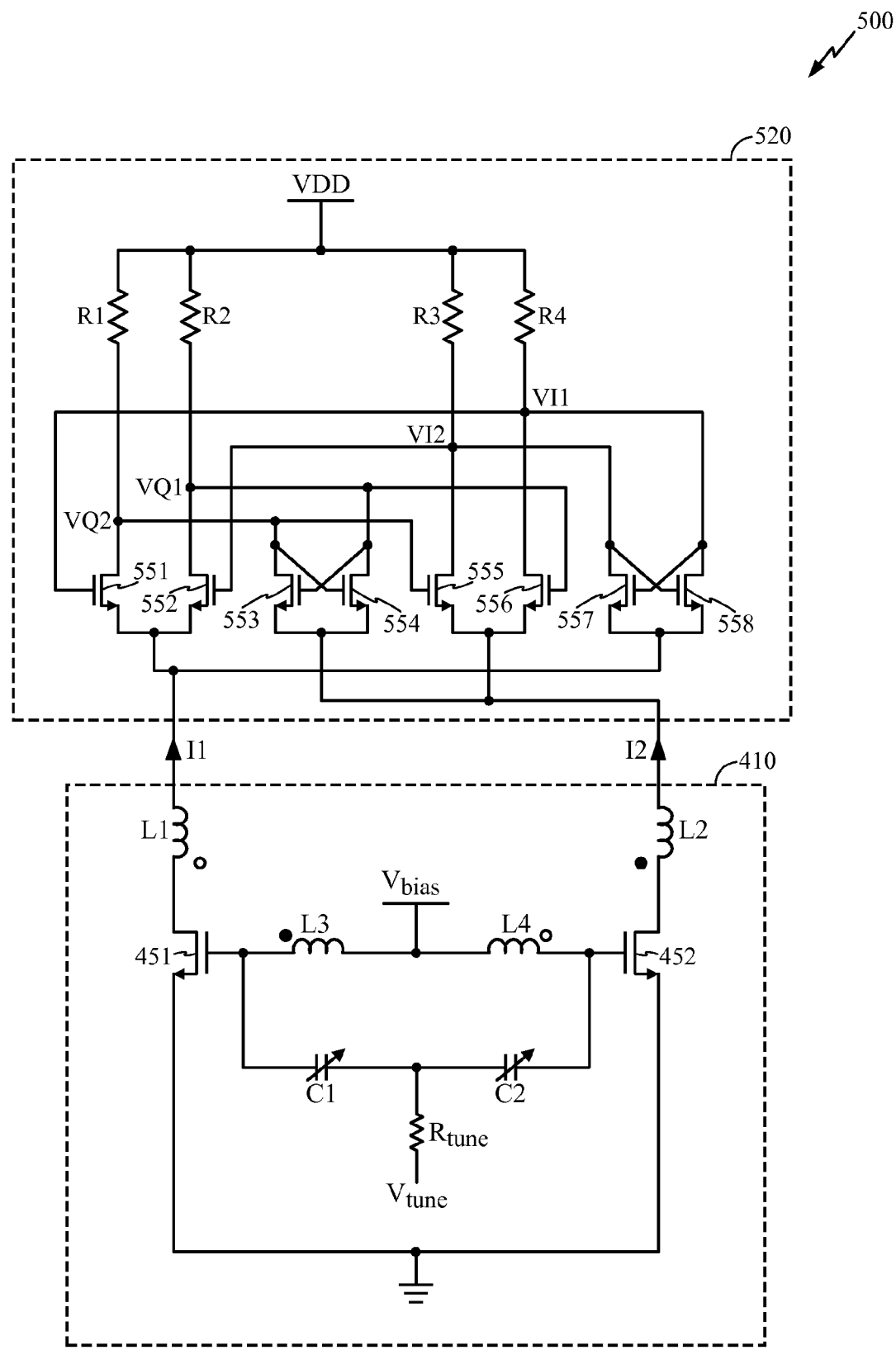
FIG. 5 illustrates an exemplary embodiment of an LO wherein an exemplary divide-by-two circuit is explicitly shown.

One of ordinary skill in the art will appreciate that the mixer or frequency divider 420 may employ any mixer or frequency divider design known in the art that accepts or can be modified to accept an input differential current I1-I2. For example, FIG. 5 illustrates an exemplary embodiment of an LO generator 500 wherein the VCO 410 is coupled to a frequency divider 520. Note the exemplary embodiment is shown for illustrative purposes only, and is not meant to limit the scope of the present disclosure to any particular frequency divider or divide-by-two circuit shown.

In FIG. 5, divide-by-two circuitry 520 utilizes resistive loads R1-R4. Note the exemplary embodiment shown is not meant to restrict the divide-by-two circuitry to the use of resistive loads or any other types of loads. The in-phase and quadrature output signals of 520 may be taken as the differential voltages VI1 (a positive in-phase voltage)–VI2 (a negative in-phase voltage) and VQ1 (a positive quadrature voltage)–VQ2 (a negative quadrature voltage), respectively. The current I1 generated by VCO 410 is supplied to transistors 551, 552, 557, 558 in the divide-by-two circuit 520, while the current I2 generated by VCO 410 may be supplied to transistors 553, 554, 555, 556 in 520.

One of ordinary skill in the art will further appreciate that in alternative exemplary embodiments (not shown), circuits producing divider ratios other than two may also be combined with the VCO 410 in the manner shown. For example, a latch-based digital divider known in the art may generate a divider ratio of four. Other types of divider circuits, e.g., injection locked dividers, may also be utilized to generate divider ratios higher than two. One of ordinary skill in the art will appreciate that such alternative frequency dividers may be readily be modified to be combined with the VCO 410 according to the techniques of the present disclosure, and such alternative exemplary embodiments are contemplated to be within the scope of the present disclosure.

Figure 6:
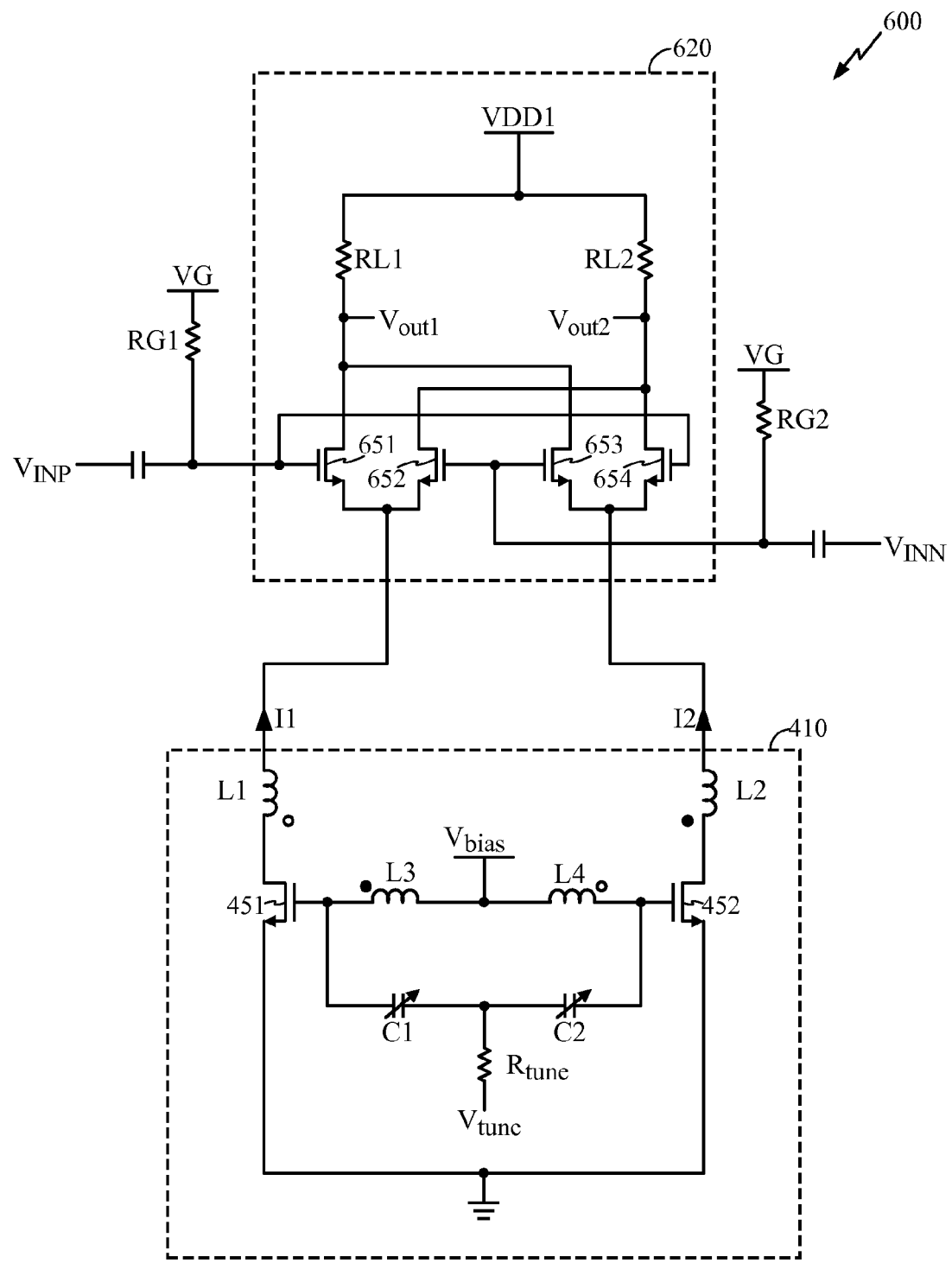
FIG. 6 further illustrates an alternative exemplary embodiment wherein a VCO is coupled to a mixer employing a similar design to that of the mixer of FIG. 3.

FIG. 6 further illustrates an alternative exemplary embodiment wherein the VCO 410 is coupled to a mixer 620. Note the exemplary embodiment is shown for illustrative purposes only, and is not meant to limit the scope of the present disclosure to any particular mixer implementation shown. One of ordinary skill in the art will appreciate that the circuitry 600 may be appropriately modified to implement any of the circuitry 130, 180, 190 shown in FIGS. 1A, 1B, 1C, respectively.

In FIG. 6, the current I1 generated by VCO 410 is supplied to 651, 652 in 620, and the current I2 generated by VCO 410 is supplied to 653, 654 in 620. The differential current I1-I2 is mixed with the differential voltage $V_{RF1}$-$V_{RF2}$. The output of the mixer may be taken as the differential voltage $V_{out1}$-$V_{out2}$.

One of ordinary skill in the art will appreciate that the circuitry 600 may be employed to generate a downconverted signal at $V_{out1}$-$V_{out2}$, such as shown in the circuitry 180 of FIG. 1B. In alternative exemplary embodiments, the circuitry 600 may also be readily applied to applications wherein, e.g., the differential current I1-I2 of the VCO 410 is directly used as an LO signal to upconvert a baseband signal $V_{INP}$-$V_{INN}$ using mixer 620, such as shown in the circuitry 190 of FIG. 1C. In yet alternative exemplary embodiments, the circuitry 600 may be employed to generate a local oscillator signal at $V_{out1}$-$V_{out2}$ such as shown in the circuitry 130 of FIG. 1A, by providing the blocks 135 and 150 of circuitry 130 using circuitry 600. Such exemplary embodiments are contemplated to be within the scope of the present disclosure.

One of ordinary skill in the art will appreciate that to optimize the design of circuits such as 500 and 600, the characteristics of the circuit elements of both the VCO 410 and the mixer 620 or frequency divider 520 are preferably simultaneously accounted for. For example, circuit simulations to determine the performance of the LO 500 preferably simultaneously account for both the VCO 410 and the divide-by-two module 520, as the behaviors of the two modules are generally inter-dependent. Furthermore, the performance of the circuit 400 in FIG. 4 may be sensitive to any output loading stages that follow the mixer 620 or frequency divider 520, e.g., an output buffer.

Figure 7:
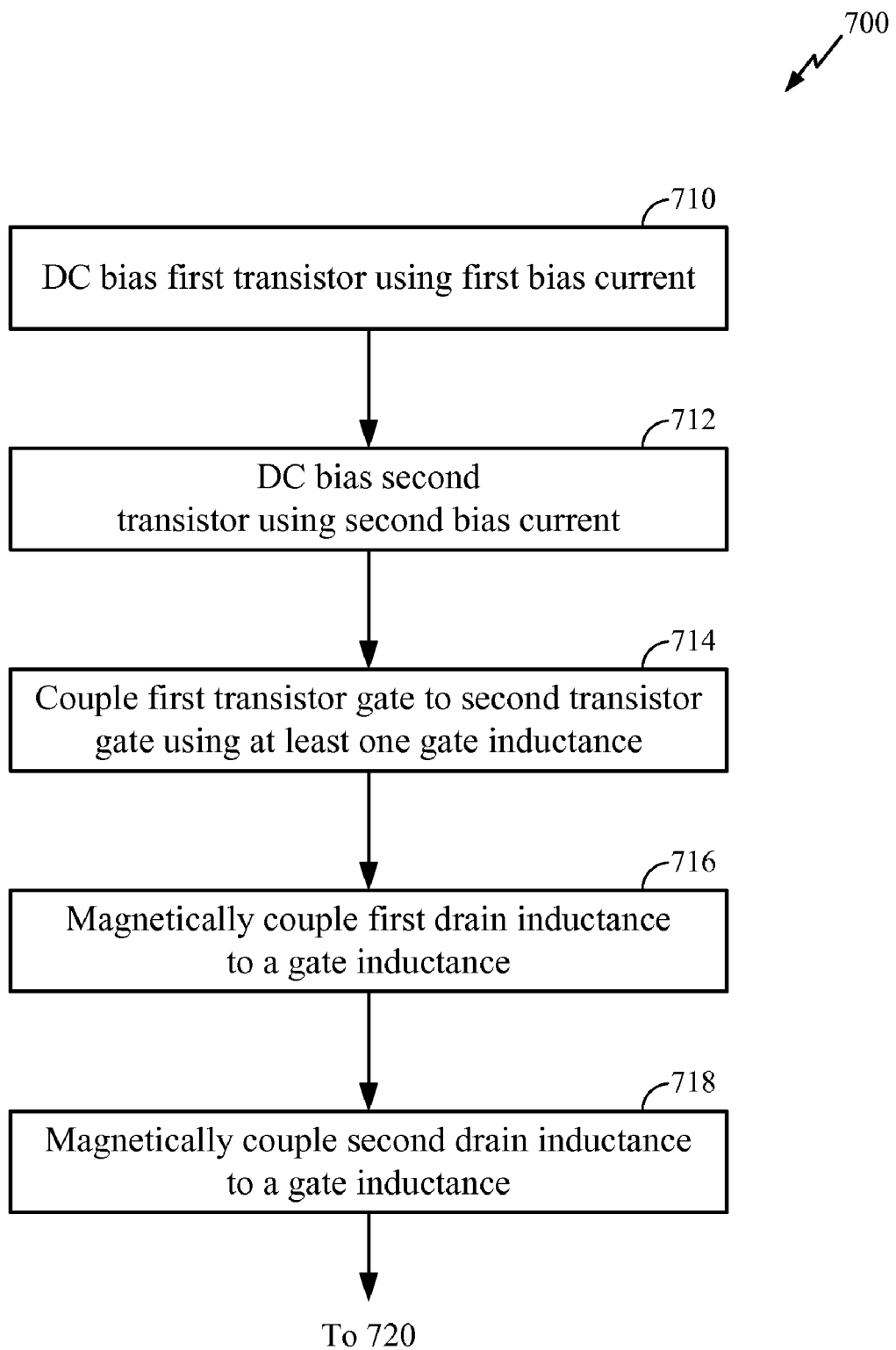
FIGS. 7 and 7A illustrate an exemplary method according to the present disclosure.
Figure 7A:
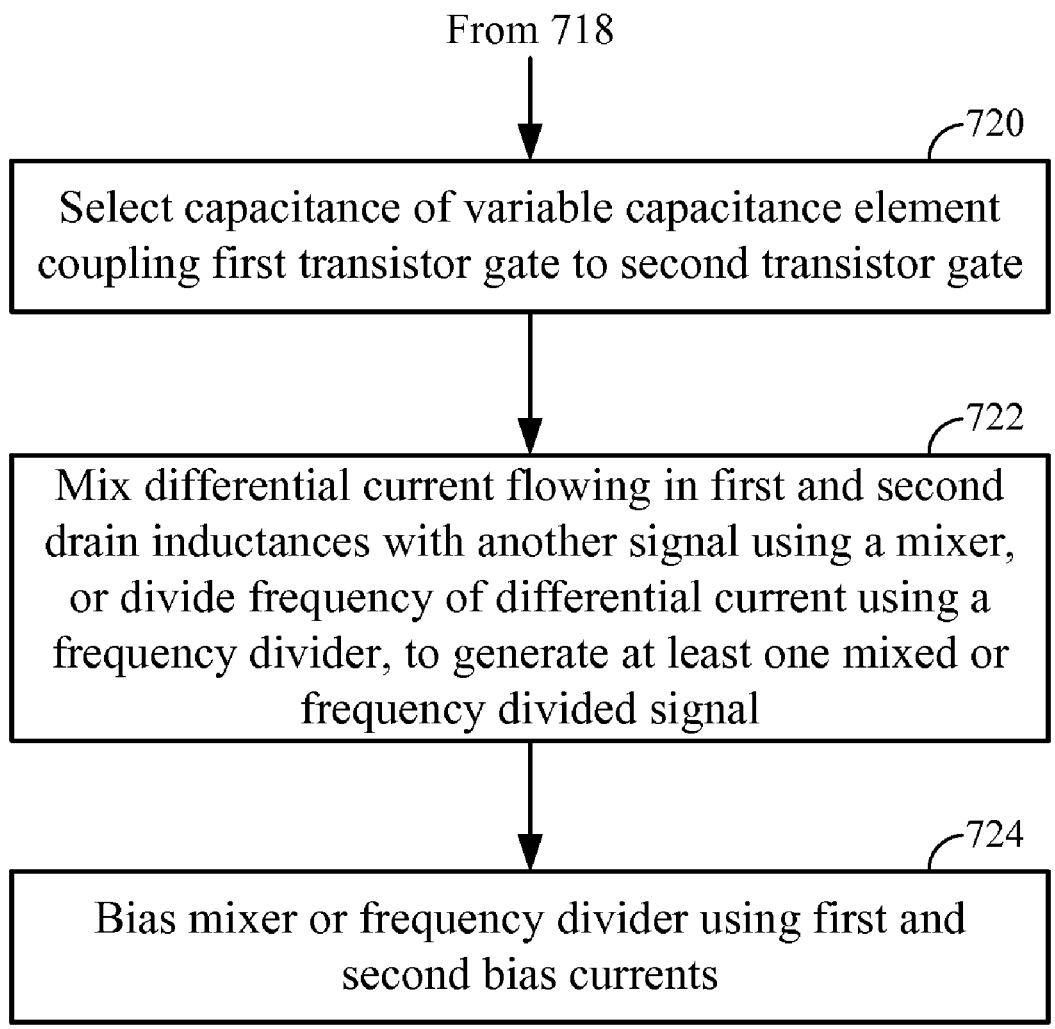

FIGS. 7 and 7A illustrate an exemplary method 700 according to the present disclosure. Note the method depicted is given for illustrative purposes only, and is not meant to restrict the scope of the present disclosure to any particular method explicitly shown. Note further that the particular sequence of steps shown is not meant to be limiting, and in general the steps may be interchangeable in sequence unless otherwise noted.

In FIG. 7, at step 710, a first transistor is DC biased using a first bias current. In an exemplary embodiment, the first transistor may be, e.g., 451 in FIG. 4.

At step 712, a second transistor is DC biased using a second bias current. In an exemplary embodiment, the second transistor may be, e.g., 452 in FIG. 4.

At step 714, the first transistor gate is coupled to the second transistor gate using at least one gate inductance. In an exemplary embodiment, the at least one gate inductance may include the inductors L3, L4 in FIG. 4, which may be implemented as two series-coupled inductors, or as one single coil, according to techniques well known in the art.

At step 716, a first drain inductance may be coupled to a gate inductance. In an exemplary embodiment, the first drain inductance may correspond to the inductance L1 in FIG. 4, and the gate inductance coupled to may correspond to the inductance L4 in FIG. 4.

At step 718, a second drain inductance may be coupled to a gate inductance. In an exemplary embodiment, the second drain inductance may correspond to the inductance L2 in FIG. 4, and the gate inductance coupled to may correspond to the inductance L3 in FIG. 4.

In FIG. 7A, at step 720, the capacitance of a variable capacitance element coupling the first transistor gate to the second transistor gate may be selected. In an exemplary embodiment, the variable capacitance element may correspond to the capacitance elements C1 and C2 in FIG. 4.

At step 722, the differential current flowing in the first and second drain inductances may be mixed with another signal using a mixer, or the frequency of the differential current may be divided using a frequency divider, to generate at least one frequency divided signal. In an exemplary embodiment, the differential current may correspond to the differential current I1-I2 in FIG. 4.

At step 724, the mixer or frequency divider may be biased by the first and second bias currents.

One of ordinary skill in the art will appreciate that while exemplary embodiments of the present disclosure have been described with reference to MOS transistors (MOSFET's), the techniques of the present disclosure need not be limited to MOSFET-based designs, and may be readily applied to alternative exemplary embodiments (not shown) employing bipolar junction transistors (or BJT's) and/or other three-terminal transconductance devices. For example, in an exemplary embodiment (not shown), the VCO 410 in FIG. 4 may utilize BJT's rather than MOSFET's, with the collectors, bases, and emitters of the BJT's coupled as shown for the drains, gates, and sources, respectively, of the MOSFET's in the VCO 410. Furthermore, unless otherwise noted, in this specification and in the claims, the terms "drain," "gate," and "source" may encompass both the conventional meanings of those terms associated with MOSFET's, as well as the corresponding nodes of other three-terminal transconductance devices, such as BJT's, which correspondence will be evident to one of ordinary skill in the art of circuit design.

Figure 8:
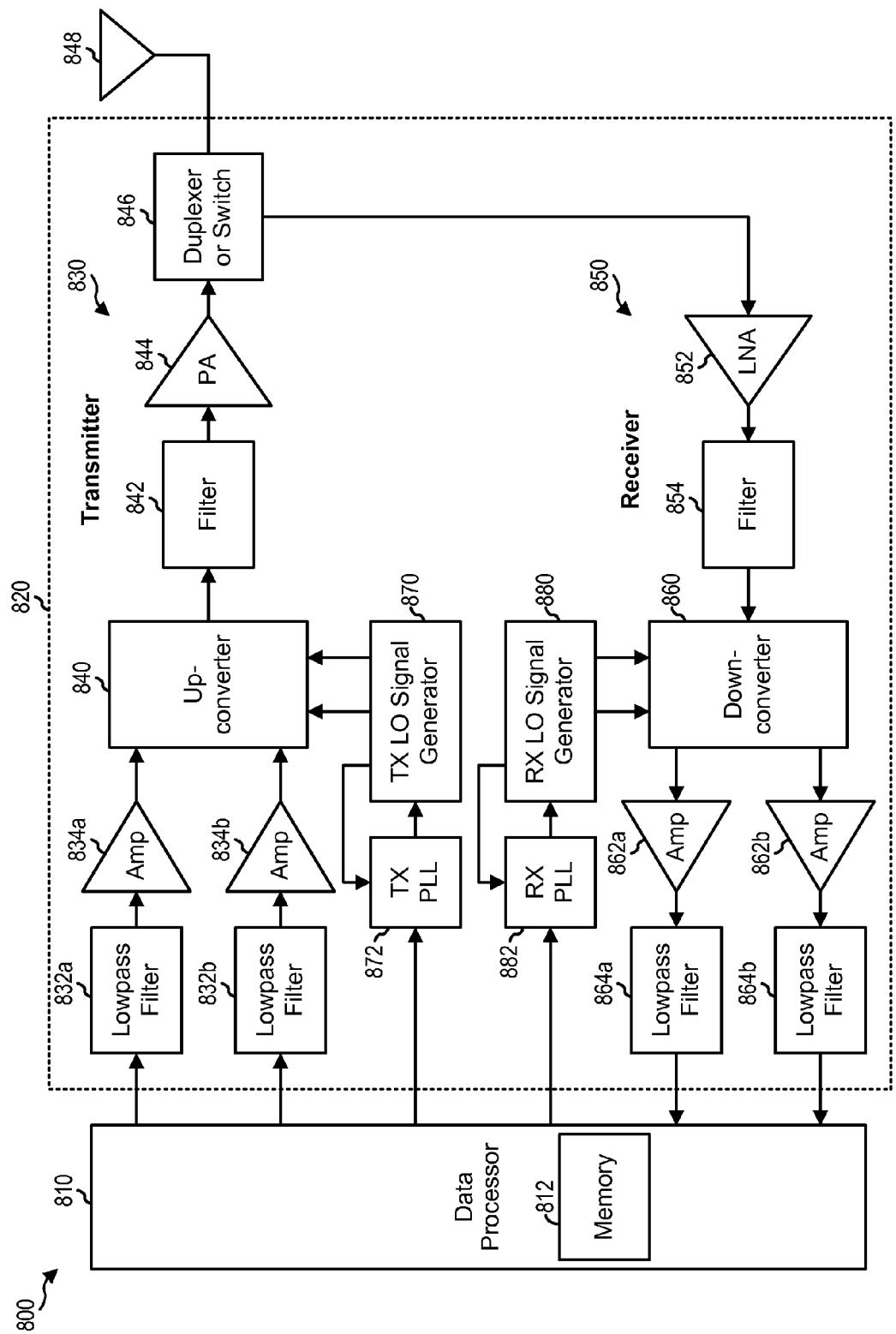
FIG. 8 shows a block diagram of a design of a wireless communication device in which the techniques of the present disclosure may be implemented.

FIG. 8 shows a block diagram of a design of a wireless communication device 800 in which the techniques of the present disclosure may be implemented. In the design shown in FIG. 8, wireless device 800 includes a transceiver 820 and a data processor 810 having a memory 812 to store data and program codes. Transceiver 820 includes a transmitter 830 and a receiver 850 that support bi-directional communication. In general, wireless device 800 may include any number of transmitters and any number of receivers for any number of communication systems and frequency bands.

A transmitter or a receiver may be implemented with a super-heterodyne architecture or a direct-conversion architecture. In the super-heterodyne architecture, a signal is frequency converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the design shown in FIG. 8, transmitter 830 and receiver 850 are implemented with the direct-conversion architecture.

In the transmit path, data processor 810 processes data to be transmitted and provides I and Q analog output signals to transmitter 830. Within transmitter 830, lowpass filters 832a and 832b filter the I and Q analog output signals, respectively, to remove undesired images caused by the prior digital-to-analog conversion. Amplifiers (Amp) 834a and 834b amplify the signals from lowpass filters 832a and 832b, respectively, and provide I and Q baseband signals. An upconverter 840 upconverts the I and Q baseband signals with I and Q transmit (TX) local oscillating (LO) signals from a TX LO signal generator 870 and provides an upconverted signal. A filter 842 filters the upconverted signal to remove undesired images caused by the frequency upconversion as well as noise in a receive frequency band. A power amplifier (PA) 844 amplifies the signal from filter 842 to obtain the desired output power level and provides a transmit RF signal. The transmit RF signal is routed through a duplexer or switch 846 and transmitted via an antenna 848.

In the receive path, antenna 848 receives signals transmitted by base stations and provides a received RF signal, which is routed through duplexer or switch 846 and provided to a low noise amplifier (LNA) 852. The received RF signal is amplified by LNA 852 and filtered by a filter 854 to obtain a desirable RF input signal. A downconverter 860 downconverts the RF input signal with I and Q receive (RX) LO signals from an RX LO signal generator 880 and provides I and Q baseband signals. The I and Q baseband signals are amplified by amplifiers 862a and 862b and further filtered by lowpass filters 864a and 864b to obtain I and Q analog input signals, which are provided to data processor 810.

TX LO signal generator 870 generates the I and Q TX LO signals used for frequency upconversion. RX LO signal generator 880 generates the I and Q RX LO signals used for frequency downconversion. Each LO signal is a periodic signal with a particular fundamental frequency. A PLL 872 receives timing information from data processor 810 and generates a control signal used to adjust the frequency and/or phase of the TX LO signals from LO signal generator 870. Similarly, a PLL 882 receives timing information from data processor 810 and generates a control signal used to adjust the frequency and/or phase of the RX LO signals from LO signal generator 880.

FIG. 8 shows an example transceiver design. In general, the conditioning of the signals in a transmitter and a receiver may be performed by one or more stages of amplifier, filter, upconverter, downconverter, etc. These circuit blocks may be arranged differently from the configuration shown in FIG. 8. Furthermore, other circuit blocks not shown in FIG. 8 may also be used to condition the signals in the transmitter and receiver. Some circuit blocks in FIG. 8 may also be omitted. All or a portion of transceiver 820 may be implemented on one or more analog integrated circuits (ICs), RF ICs (RFICs), mixed-signal ICs, etc.

LO signal generators 870 and 880 may each include a frequency divider that receives a clock signal and provides a divider output signal. The clock signal may be generated by a voltage-controlled oscillator (VCO) or some other types of oscillator. The clock signal may also be referred to as a VCO signal, an oscillator signal, etc. In any case, it may be desirable to obtain differential output signals from a frequency divider. The techniques of the present disclosure may be readily applied to the design of LO signal generators 870 and 880.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the exemplary embodiments disclosed herein may be implemented as electronic hardware, computer software, or combinations of both. To clearly depict this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other exemplary embodiments without departing from the spirit or scope of the invention. Thus, the present invention is not intended to be limited to the exemplary embodiments shown herein but is to be accorded the widest scope consistent with the principles and novel features disclosed herein.

The invention claimed is:

1. An apparatus comprising a voltage controlled oscillator (VCO) coupled to a mixer, the VCO comprising:
   a first transistor configured to be DC biased by a first bias current;
   a second transistor configured to be DC biased by a second bias current;
   at least one gate inductance coupling the gate of the first transistor to the gate of the second transistor;
   a first drain inductance magnetically coupled to the at least one gate inductance, the first drain inductance coupled to the drain of the first transistor;
   a second drain inductance magnetically coupled to the at least one gate inductance, the second drain inductance coupled to the drain of the second transistor; and
   at least one variable capacitance coupling the gate of the first transistor to the gate of the second transistor,
   the mixer comprising first and second input nodes coupled to the first and second drain inductances, respectively, the mixer configured to be biased by the first and second bias currents, the at least one gate inductance being formed by a primary coil, the first and second drain inductances being formed by two secondary coils, and the two secondary coils being laid out inside or stacked underneath the primary coil.

2. The apparatus of claim 1, the mixer configured to mix the differential current flowing through the first and second nodes with a second signal to generate a mixed output signal.

3. The apparatus of claim 2, the second signal comprising a baseband signal, the mixed output signal comprising an upconverted signal.

4. The apparatus of claim 2, the mixed output signal being a local oscillator signal.

5. The apparatus of claim 2, the first and second gate inductances and the first and second drain inductances being formed by a single transformer.

6. The apparatus of claim 2, the second signal comprising a received radio frequency (RF) signal.

7. The apparatus of claim 1, the at least one gate inductance comprising a first gate inductance and a second gate inductance, the first gate inductance coupling the gate of the first transistor to a DC voltage, the second gate inductance coupling the gate of the second transistor to the DC voltage, the first gate inductance magnetically coupled to the second drain inductance, the second gate inductance magnetically coupled to the first drain inductance.

8. The apparatus of claim 1, the at least one variable capacitance comprising a varactor.

9. The apparatus of claim 1, the at least one variable capacitance comprising a switchable capacitor bank.

10. A method for generating a mixed signal, the method comprising:
DC biasing a first transistor using a first bias current;
DC biasing a second transistor using a second bias current;
coupling the gate of the first transistor to the gate of the second transistor using at least one gate inductance;
magnetically coupling a first drain inductance to the at least one gate inductance, the first drain inductance coupled to the drain of the first transistor;
magnetically coupling a second drain inductance to the at least one gate inductance, the second drain inductance coupled to the drain of the second transistor;
selecting the capacitance of a variable capacitance element coupling the gate of the first transistor to the gate of the second transistor;
mixing the differential current flowing in the first and second drain inductances with another signal using a mixer to generate at least one mixed signal; and
biasing the mixer using the first and second bias currents, wherein the at least one gate inductance is formed by a primary coil, wherein the first and second drain inductances are formed by two secondary coils, and wherein the two secondary coils are laid out inside or stacked underneath the primary coil.

11. The method of claim 10, the at least one gate inductance comprising a first gate inductance and a second gate inductance, the first gate inductance coupling the gate of the first transistor to a DC voltage, the second gate inductance coupling the gate of the second transistor to the DC voltage, the magnetically coupling the first drain inductance to a gate inductance comprising magnetically coupling the first drain inductance to the second gate inductance, the magnetically coupling the second drain inductance to a gate inductance comprising magnetically coupling the second drain inductance to the first gate inductance.

12. The method of claim 10, the selecting the capacitance comprising varying the voltage across a varactor.

13. The method of claim 10, the selecting the capacitance comprising switching capacitors in a capacitor bank.

14. The method of claim 10, the mixing comprising mixing the differential current flowing in the first and second drain inductances with a received radio-frequency (RF) signal.

15. The method of claim 10, the mixing comprising mixing the differential current flowing in the first and second drain inductances with a baseband signal, the generated mixed signal comprising an upconverted signal.

16. The method of claim 10, the generated mixed signal being a local oscillator signal.

17. An apparatus comprising:
means for generating a differential voltage controlled oscillator (VCO) output current having a voltage-controlled frequency, the means for generating comprising a VCO, the VCO configured to be biased by at least one bias current; and
means for mixing the VCO output current with another signal, wherein the means for mixing is configured to share the at least one bias current with the VCO, the VCO comprising:
a first transistor;
a second transistor;
at least one gate inductance coupling the gate of the first transistor to the gate of the second transistor;
a first drain inductance coupled to the drain of the first transistor; and
a second drain inductance coupled to the drain of the second transistor, wherein the at least one gate inductance is formed by a primary coil, wherein the first and second drain inductances are formed by two secondary coils, and wherein the two secondary coils are laid out inside or stacked underneath the primary coil.

18. A device for wireless communications, the device comprising a TX LO signal generator, at least one baseband TX amplifier, an upconverter coupled to the TX LO signal generator and the at least one baseband TX amplifier, a TX filter coupled to the output of the upconverter, a power amplifier (PA) coupled to the TX filter, an RX LO signal generator, an RX filter, a downconverter coupled to the RX LO signal generator and the RX filter, a low-noise amplifier (LNA) coupled to the RX filter, and a duplexer coupled to the PA and the LNA, the TX LO signal generator and upconverter comprising a voltage controlled oscillator (VCO) coupled to a mixer, the VCO comprising:
a first transistor configured to be DC biased by a first bias current;
a second transistor configured to be DC biased by a second bias current;
at least one gate inductance coupling the gate of the first transistor to the gate of the second transistor;
a first drain inductance magnetically coupled to the at least one gate inductance, the first drain inductance coupled to the drain of the first transistor;
a second drain inductance magnetically coupled to the at least one gate inductance, the second drain inductance coupled to the drain of the second transistor; and
at least one variable capacitance coupling the gate of the first transistor to the gate of the second transistor,
the mixer comprising first and second input nodes coupled to the first and second drain inductances, respectively, the mixer configured to be biased by the first and second bias currents, the at least one gate inductance being formed by a primary coil, the first and second drain inductances being formed by two secondary coils, and the two secondary coils being laid out inside or being stacked underneath the primary coil.

19. A device for wireless communications, the device comprising a TX LO signal generator, at least one baseband TX amplifier, an upconverter coupled to the TX LO signal generator and the at least one baseband TX amplifier, a TX filter coupled to the output of the upconverter, a power amplifier (PA) coupled to the TX filter, an RX LO signal generator, an RX filter, a downconverter coupled to the RX LO signal generator and the RX filter, a low-noise amplifier (LNA) coupled to the RX filter, and a duplexer coupled to the PA and the LNA, the RX LO signal generator and downconverter comprising a voltage controlled oscillator (VCO) coupled to a mixer, the VCO comprising:
a first transistor configured to be DC biased by a first bias current;
a second transistor configured to be DC biased by a second bias current;
at least one gate inductance coupling the gate of the first transistor to the gate of the second transistor;
a first drain inductance magnetically coupled to the at least one gate inductance, the first drain inductance coupled to the drain of the first transistor;
a second drain inductance magnetically coupled to the at least one gate inductance, the second drain inductance coupled to the drain of the second transistor; and
at least one variable capacitance coupling the gate of the first transistor to the gate of the second transistor, the mixer comprising first and second input nodes coupled to the first and second drain inductances, respectively, the mixer configured to be biased by the first and second bias currents, the at least one gate inductance being formed by a primary coil, the first and second drain inductances being formed by two secondary coils, and the two secondary coils being laid out inside or being stacked underneath the primary coil.

* * * * *